United States Patent
Murarka et al.

(10) Patent No.: US 11,754,394 B2
(45) Date of Patent: Sep. 12, 2023

(54) SYSTEMS AND METHODS FOR MEASURING THE RATE OF ANGULAR DISPLACEMENT USING MAGNETIC FIELD SENSING

(71) Applicant: SeeHow Pte. Ltd., Singapore (SG)

(72) Inventors: Apoorva Murarka, Cambridge, MA (US); Dev Chandan Behera, Odisha (IN)

(73) Assignee: SEEHOW PTE. LTD., Singapore (SG)

( * ) Notice: Subject to any disclaimer, the term of this patent is extended or adjusted under 35 U.S.C. 154(b) by 0 days.

(21) Appl. No.: 16/999,707

(22) Filed: Aug. 21, 2020

(65) Prior Publication Data

US 2021/0055107 A1 Feb. 25, 2021

Related U.S. Application Data

(60) Provisional application No. 62/889,565, filed on Aug. 21, 2019.

(51) Int. Cl.
*G01C 19/24* (2006.01)
*G01P 15/14* (2013.01)

(52) U.S. Cl.
CPC .............. *G01C 19/24* (2013.01); *G01P 15/14* (2013.01); *B81B 2201/0235* (2013.01); *B81B 2201/0242* (2013.01)

(58) Field of Classification Search
CPC .............. A63B 43/004; A63B 2220/34; A63B 2220/36; A63B 24/00; A63B 2102/20;

(Continued)

(56) References Cited

U.S. PATENT DOCUMENTS

| | | | | |
|---|---|---|---|---|
| 3,796,942 A | * | 3/1974 | Bynum | B60T 8/172 361/239 |
| 2018/0339208 A1 | * | 11/2018 | Kerhuel | A63B 24/0006 |
| 2020/0103230 A1 | * | 4/2020 | Yamamoto | G01P 3/48 |

FOREIGN PATENT DOCUMENTS

| | | | | |
|---|---|---|---|---|
| GB | 2440510 A | * | 2/2008 | A63B 43/00 |
| WO | WO-2018180076 A1 | * | 10/2018 | A63B 43/00 |

OTHER PUBLICATIONS

Angular velocity. (2014). In M. Clugston, The Penguin dictionary of science (4th ed.). Penguin. Credo Reference: https://search.credoreference.com/content/entry/penguinscience/angular_velocity/0?institutionId=743 (Year: 2014).*

(Continued)

*Primary Examiner* — Feba Pothen
*Assistant Examiner* — Martin Walter Braunlich
(74) *Attorney, Agent, or Firm* — Ryan Alley IP

(57) ABSTRACT

This invention discloses a method for measuring the rate of angular displacement, of a traveling object, using magnetic field sensing, said method comprising: measuring magnetic field intensity and/or changes in said magnetic field intensity, projected onto a magnetic field sensor coupled to said traveling object, each measurement being per orthogonal rotation axis to provide a magnetic field intensity value per axis and/or a change in magnetic field intensity per axis, as said object's orientation changes with time; determining, number of peaks, present in a measurement sample comprising a set of said measurements, of time duration; and computing said rate of angular displacement, for said traveling object, as a function of said determined number of peaks and said time duration.

21 Claims, 4 Drawing Sheets

(58) Field of Classification Search
CPC .... B81B 2201/0235; B81B 2201/0242; G01C 19/24; G01C 19/58; G01C 21/165; G01C 17/28; G01C 17/02; G01P 3/48; G01P 15/14; G01P 3/481; G01P 15/105; G01P 15/18; G01P 3/44; G01R 33/0206; G01R 33/02

See application file for complete search history.

(56) References Cited

OTHER PUBLICATIONS

English machine translation of WO-2018180076-A1 (Year: 2018).*

* cited by examiner

SYSTEMS AND METHODS FOR MEASURING THE RATE OF ANGULAR DISPLACEMENT USING MAGNETIC FIELD SENSING

RELATED APPLICATIONS

This application claims priority under 35 U.S.C. § 119 to U.S. Provisional Application 62/889,565, all filed Aug. 21, 2019 and incorporated by reference herein in its entirety.

FIELD

This invention relates to the field of electronics engineering. Particularly, this invention relates to a method for measuring the rate of angular displacement using magnetic field sensing.

BACKGROUND

Prevalent (and conventional) electronic gyroscopes or angular rate sensors detect the rate of angular displacement of an object or a body to which they are attached or integrated by sensing the Coriolis force that acts on the body in a frame of reference of the angularly displacing body.

As ubiquitous as these single-axis or multi-axes electronic gyroscopes have become in consumer electronics, wearables, and smart devices—with the advent of large-scale microelectromechanical system (MEMS) fabrication technologies—they are found to be severely lacking in performance for several applications. These performance parameters can comprise angular displacement rate (degrees/second or radians/sec or a similar measure), angular displacement angle, drift, dynamic range of angular displacement rate and/or angle measured, and sensitivity of angular displacement rate and/or angle measured, among others.

MEMS gyroscopes can measure angular velocity. Although MEMS gyroscopes are simpler to integrate, they are widely believed to be a low-cost solution for medium-performance requirements.

There is, therefore, a need to improve accuracy and therefore, reliability, by providing a system and method which measures the rate of angular displacement.

SUMMARY

An object of the invention is to provide a system and method which measures the rate of angular displacement using magnetic field sensing.

Another object of the invention is to provide a system and method wherein higher rates of angular displacement can be detected without compromising accuracy of measurement.

Yet another object of the invention is to provide a system and method for mitigation of drift errors which are generally associated with operation of proof-mass based tuning fork gyroscopes.

According to an embodiment of this invention, there is disclosed a method for measuring the rate of angular displacement, of a traveling object, using magnetic field sensing, said method comprises:
measuring magnetic field intensity and/or changes in said magnetic field intensity, projected onto a magnetic field sensor coupled to said traveling object, each measurement being per orthogonal rotation axis to provide a magnetic field intensity value per axis and/or a change in magnetic field intensity per axis, as said object's orientation changes with time;
determining, number of peaks, present in a measurement sample comprising a set of said measurements, of time duration; and
computing said rate of angular displacement, for said traveling object, as a function of said determined number of peaks and said time duration.

In at least an embodiment, said method comprises a step of determining a value proportional to frequency of number of peaks, detected by a peak counter, in said magnetic field sensor's measurements.

In at least an embodiment, said method is configured to determine:
angular displacement of said traveling object for each of the individual rotational axes; and/or
rate of angular displacement of said traveling object for each of the individual rotational axes; and/or
change in angle and/or orientation of said object.

In at least an embodiment, said magnetic field sensor is a single device with three orthogonal sense axes.

In at least an embodiment, said magnetic field sensor is a sensor selected from a group consisting of a 1-axis magnetic field sensor, a 2-axis magnetic field sensor, and a 3-axis magnetic field sensor.

In at least an embodiment, for a magnetic field across a trajectory of said traveling object, said method comprises a step of varying the number of measurements and/or varying the duration of sampling time.

According to another embodiment of this invention, there is disclosed a system for measuring the rate of angular displacement, of a traveling object, using magnetic field sensing, said system comprises:
a magnetic field sensor, coupled to said object, in order to measure magnetic field intensity and changes in said magnetic field intensity, projected onto said magnetic field sensor, each measurement being per orthogonal rotation axis to provide a magnetic field intensity value per axis, and a change in magnetic field intensity per axis, as said object's orientation changes with time;
a peak counter configured to receive output from said magnetic field sensor, output of said peak counter being number of peaks present in a measurement sample of time duration; and
at least one processor,
a non-transitory computer readable storage medium comprising instructions that, when executed by the at least one processor, causes the system to perform at least one of the steps from the following steps:
measuring change in projection, of a magnetic field, on each one of said orthogonal rotation axes, corresponding to changing magnetic field intensity of said magnetic field about each of said axes, said measurement being correlative to said object's angular displacement, projected onto those one or more orthogonal axes, causing change in its orientation; and
determining said magnetic field sensor's angular displacement and/or position, in an existing magnetic field, as a composition of measured change in projections of said magnetic field onto said orthogonal rotation axes of said magnetic field sensor, to measure at least a rate of angular displacement of said object for each of the individual rotational axes.

In at least an embodiment of the system, said processor, with instructions, is configured to perform a further step of computing a composite rate of angular displacement, wherein the determining step comprises the steps of:

measuring peaks from the output of each individual rotational axis of said magnetic field sensor;

counting the number of peaks present in a measurement of a time duration; and computing a composite rate of angular displacement of said magnetic field sensor and said traveling object about one or more rotation axis.

In at least an embodiment of the system, said processor, with instructions, is configured to perform a further step of computing a composite rate of angular displacement, wherein the determining step comprises the steps of:

measuring peaks from the output of each individual rotational axis of a magnetic field sensor;

counting the number of peaks present in a measurement of a time duration; and computing a composite rate of angular displacement of said magnetic field sensor and said traveling object about one or more rotation axes wherein, the composite rate of angular displacement is computed as a function of square root of sum of squares of the rate of angular displacement about one or more rotational axes.

In at least an embodiment of the system, said processor, with instructions, is configured to perform a further step of computing a composite rate of angular displacement, wherein the determining step comprises the steps of:

computing, a square root of sum of squares of the measurements from the output of each of the orthogonal rotational axes of the magnetic field sensor, to obtain a computed value;

counting the number of peaks present, in a measurement of a time duration, from said computed value, to obtain counted number of peaks; and computing a composite rate of angular displacement of said magnetic field sensor and said traveling object about one or more rotation axis, using said computed value and said counted number of peaks.

In at least an embodiment of the system, said system comprises a frequency-to-voltage converter, communicably coupled to said processor, configured to determine a value proportional to frequency of number of peaks, detected by said peak counter, in said magnetic field sensor's measurements.

In at least an embodiment of the system, said system is configured to determine:

angular displacement of said traveling object for each of the individual rotational axes; and/or rate of angular displacement of said traveling object for each of the individual rotational axes; and/or change in angle and/or orientation of said object.

In at least an embodiment of the system, said system comprises:

an inertial measurement unit further comprising one or more of a single-axis accelerometer or a multi-axis accelerometer providing accelerometer data; and said processor, and said non-transitory computer readable storage medium comprising instructions that, when executed by the at least one processor, causes the system to compute position of said traveling object, by using said orientation data to compensate for gravity on accelerometer measurement and then by double integrating said accelerometer data.

In at least an embodiment of the system, said magnetic field sensor is a single device with three orthogonal sense axes.

In at least an embodiment of the system, said magnetic field sensor is a sensor selected from a group consisting of a 1-axis magnetic field sensor, a 2-axis magnetic field sensor, and a 3-axis magnetic field sensor.

In at least an embodiment of the system, for a magnetic field across a trajectory of said traveling object, said step of measuring comprising a step of varying the number of measurements and/or varying the duration of sampling time.

According to another embodiment of this invention, there is disclosed a system for measuring the rate of angular displacement, of an object, traveling along a trajectory, using magnetic field sensing, said system comprises:

a magnetic field sensor, in said travelling object, to output magnetic field sensor signals in terms of measurement data along each orthogonal rotation axis;

a transmitter to transmit said data to a receiver;

a receiver to receive said transmitted data, said receiver being communicably coupled to at least one processor, and a non-transitory computer readable storage medium comprising instructions that, when executed by the at least one processor, causes the system to perform at least one of the steps from the following steps:

transferring received data to said processor for storage and computation;

computing a composite average rate of angular displacement by:

reducing noise from said data to achieve relatively higher fidelity data;

segmenting said trajectory from said relatively higher fidelity data;

counting number of peaks present in a measurement of a time duration using a peak detection algorithm controlled by a threshold parameter which is optimized for corresponding segmented trajectories; and computing orientation of said traveling object, by integrating the composite average rate of angular displacement, along each orthogonal rotation axis, to obtain orientation data.

In at least an embodiment, said system comprises:

an inertial measurement unit further comprising one or more of a single-axis accelerometer or a multi-axis accelerometer providing accelerometer data; and said processor, and said non-transitory computer readable storage medium comprising instructions that, when executed by the at least one processor, causes the system to compute position of said traveling object, by using said orientation data to compensate for gravity on accelerometer measurement and then by double integrating said accelerometer data.

In at least an embodiment, said system comprises:

an inertial measurement unit further comprising one or more of a single-axis gyroscope or a multi-axis gyroscope providing gyroscope data; and said processor, and said non-transitory computer readable storage medium comprising instructions that, when executed by the at least one processor, causes the system to use said gyroscope data to verify the fidelity of computed orientation of said traveling object.

In at least an embodiment, said traveling object is one of a linearly traveling object, an angularly displacing traveling object, or a linearly traveling angularly displacing object;

In at least an embodiment, said magnetic field sensor is embedded in said travelling object.

BRIEF DESCRIPTION OF THE DRAWINGS

The invention will now be described in relation to the accompanying drawings, in which.

DETAILED DESCRIPTION

Figure 1:
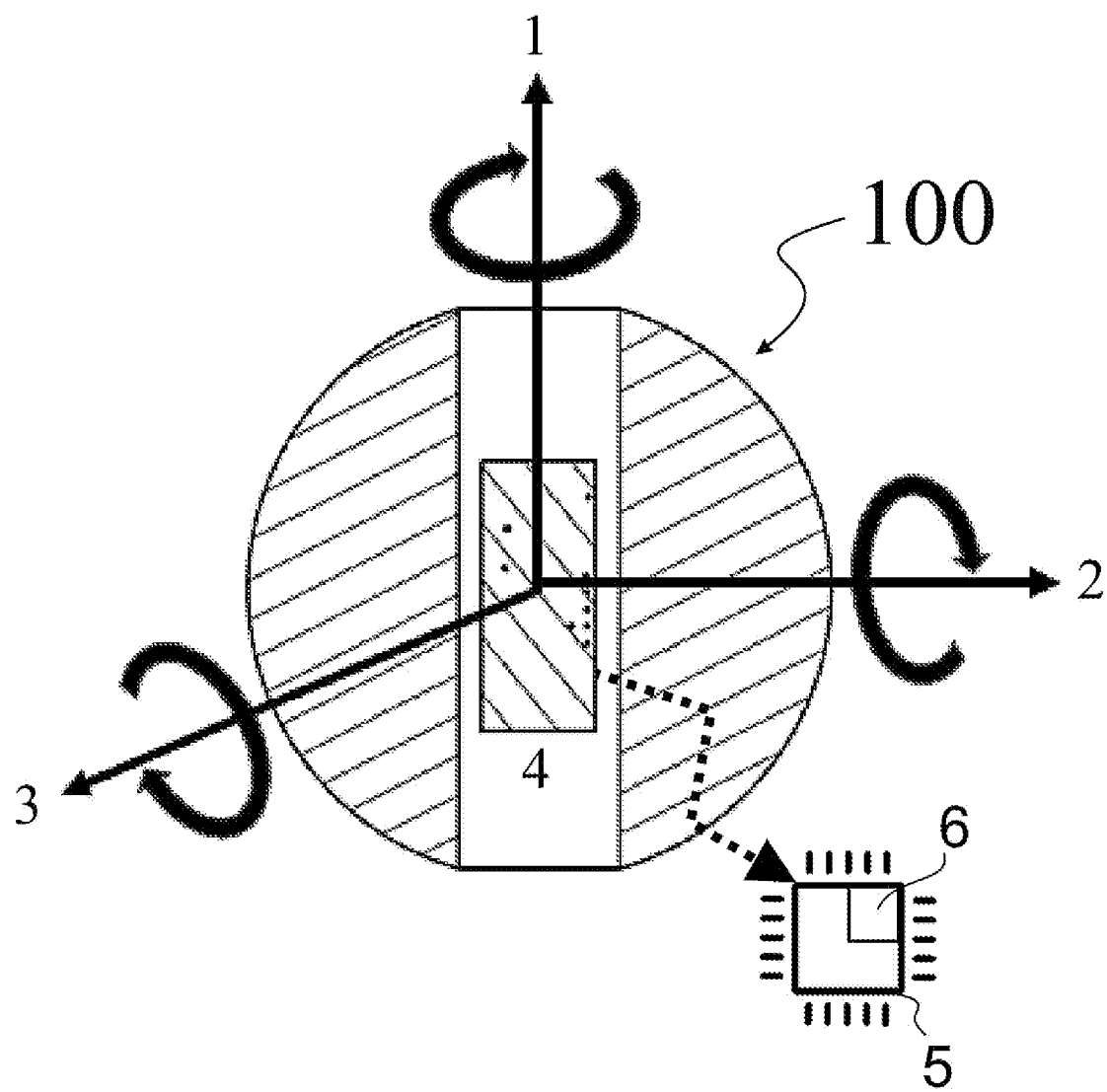
FIG. 1 illustrates orthogonal magnetic field sensor/sensing axes with the sensor disposed in an object.

According to this invention, there is provided a system and method for measuring the rate of angular displacement using magnetic field sensing.

This invention pertains to measuring angular rates of change of an object (or angular displacement rates) by detecting changes in the object's orientation with respect to terrestrial magnetic fields such as the Earth's magnetic field. Advantages of this approach over prior art electronic gyroscopes and other rotation rate measurement methods is that higher rates of angular displacement can be detected without compromising accuracy of measurement. Additionally, by using the presented method, a larger dynamic range of angular displacement rates can be detected or measured without compromising accuracy of measurement. Other advantages of the presented method over prior art electronic gyroscopes include mitigation of drift errors associated with operation of proof-mass based tuning fork gyroscopes.

An object in this disclosure can refer to a body or mass that is in motion. Such motion can be linear, angular, or a combination thereof. An example of such an object or projectile would be a pitched or thrown or hit or struck cricket ball, baseball, basketball, golf ball, a tiny satellite, drones, unmanned aerial vehicles, robots, etc.

The word "travel" is used here to mean motion of either the rotational (angular displacement) kind or linear kind or a combination of both kinds. For example, a ball or an object that stays in place, but keeps rotating about one or more axes is said to be in motion or "traveling" and so is a ball or an object that moves between two different positions.

Disclosed method assumes that, for short travel distances or short sample durations or measurement times, the magnetic field present through the entire trajectory of the projectile (such as a traveling ball) remains constant or nearly uniform, or it can be considered nearly constant during small sampling or measurement times. Additionally, the disclosed method can be used for detecting angular displacement rate and angles even when the magnetic field is not uniform throughout the trajectory of the projectile by adjusting sampling or measurement times to be small enough to incur minimal error in deduced rotation rate. In such a scenario, the number of measurements made is increased and/or the duration of each measurement (the sampling time or duration, T) is decreased. Thus, depending on conditions and requirement, number of measurements may be varied and/or sampling time duration may be varied.

In at least an embodiment, the term, 'trajectory', is meant to include one or more of the following (with respect to the traveling object):
linear displacement;
angular displacement;
combination of linear displacement and angular displacement;
displacement having constant linear velocity;
displacement having constant angular velocity;
displacement having changing linear velocity;
displacement having changing angular velocity.

In at least an exemplary embodiment, the term, 'trajectory' (with respect to the traveling object), is meant to include:
release of a moving baseball from pitcher's arm;
delivery of a moving cricket ball by a bowler;
trajectory of a football following a kick;
downswing of a cricket bat by a batsman;
swing of a golf club;
swing of a baseball bat;
swing of a tennis racquet;
motion of a boxing glove;
flight of a cricket ball, or a baseball, or a golf ball after being struck by a cricket bat, or a baseball bat, or a golf club, respectively;
release of a bowling ball (in ten-pin bowling, for example) by a bowler.
motion of a bowling ball down a bowling lane.

In at least an embodiment, the term, 'optimization', is meant to include any one or all of the following (so as to better detect peaks, or to better identify events, in one or more of the aforementioned 'trajectories' and/or segments of 'trajectories')::
selection of threshold parameter(s);
variation of threshold parameter(s);
calibration of threshold parameter(s);
hyper-parameter tuning of threshold parameter(s).

FIG. 1 illustrates orthogonal magnetic field sensor/sensing axes with the sensor disposed in an object 100.

As a traveling object 100 executes angular displacement about one or more orthogonal axes (arbitrarily defined as pitch, yaw, and roll axes or x, y, and z axes) (represented by reference numerals 1, 2, 3) through its trajectory, its orientation or attitude with respect to a magnetic field (for example, the Earth's magnetic field or a generated magnetic field) changes. As this orientation changes, projection of this magnetic field on each one of the orthogonal rotation axes also changes, corresponding to the changing intensity of the magnetic field about or upon that axis.

It is to be noted that the reference numerals referring to "1, 2, 3" axis labeling is arbitrary and can be replaced with reference numerals "x, y, z" axes. The three axes are/can be orthogonal.

In at least an embodiment, a magnetic field sensor or a magnetic intensity sensor (also called a magnetometer) may be used, communicably coupled to the object, in order to sense or detect or measure (and record) magnetic field intensity and its changes as the object's orientation or attitude changes with time. Such a magnetic field sensor can have multiple sense axes (one or two or three or more) and these sense axes can be orthogonal to each other. At any given instance in the existing magnetic field, the magnetometer's position (angular position, linear position, attitude, position in space) can be described and/or recorded as a composition of projections of the magnetic field onto the orthogonal sense axes of the magnetometer. This composition of projections can be achieved by any number of mathematical operations. The magnetometer's (reference numeral 4) orthogonal sense axes can be used as the three orthogonal and arbitrarily-assigned rotation axes (yaw, pitch, roll) of a traveling object if the magnetometer is disposed on or inside the object. As the object angularly displaces, the projections of the magnetic field upon the one or more of the individual orthogonal sense axes of the magnetometer increase as one or more of the individual axes move toward the magnetic field (or align closer to the field) and the projections of the magnetic field upon the one or more of the individual orthogonal sense axes of the magnetometer decrease as one or more of the individual axes move away from the magnetic field. For a magnetometer disposed in an angularly displacing body, this effect can be used to detect the rate of angular displacement and the change in angle or attitude or orientation of the angularly displacing body.

Additionally, the magnetometer can also be just a single-axis or a dual-axes magnetometer.

The magnetic field intensity per axis may be magnetic field intensity vector per axis.

Figure 2:
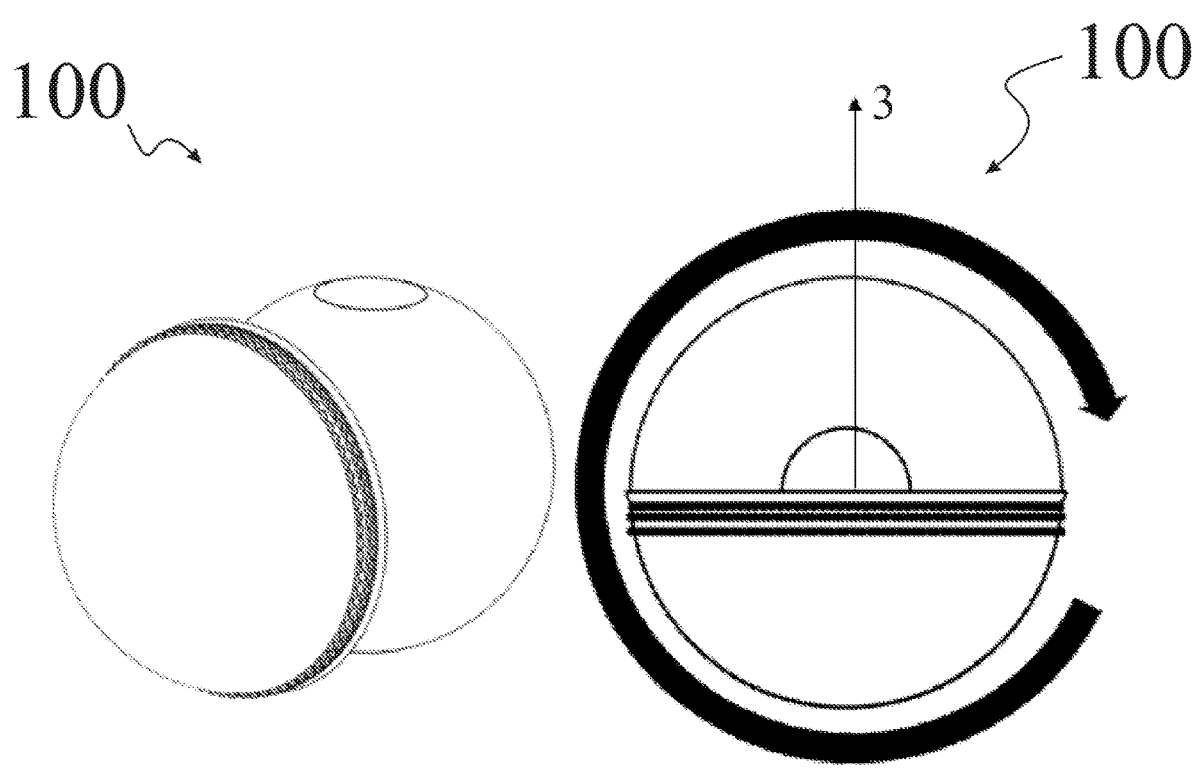
FIG. 2 illustrates an object that is rotating about an axis that is aligned with one of the orthogonal sense axes of the magnetometer that is disposed inside said rotating object.

FIG. 2 illustrates an object that is rotating about an axis that is aligned with one of the orthogonal sense axes of the magnetometer that is disposed inside said rotating object.

In at least an embodiment of this method, steps for measuring a rate of angular displacement (rotation) are disclosed.

The measurements from each individual sense axis of a magnetometer peak (or reach a temporally-local or a global maximum value) whenever the magnetic field's projection on that axis is maximum. Consecutive peaks in magnetometer measurements for any of its particular sense axes indicate the completion of one complete rotation of 360 degrees or $2*\pi$ radians (where $\pi$ is the ratio of a circle's circumference to its diameter and equal to 3.141592 . . . ) about that particular axis. The duration between consecutive peaks in the magnetometer measurement indicates the time taken to complete one complete rotation of 360 degrees. Therefore, by counting the number of peaks present (N) in a measurement of a finite duration (time T), the angular displacement (rotation) rate ($\Omega$) or angular rate of change of the magnetometer (and the object on/in which it is disposed) about a particular magnetometer sense axis can be calculated as $\Omega=(360*N)/T$ degrees/second (or degrees/minute or a similar unit of measurement for angle displaced per unit time). Alternatively, the angular rate can also be calculated as $\Omega=(2*\pi*N)/T$ where $\Omega$ is in units of radians/sec or radians/minute or similar. Such calculations can be repeated similarly for magnetic field measurements from each of the orthogonal axes of the magnetometer/s to calculate the angular rate of rotation of the magnetometer/s (or the body upon or within which the magnetometer/s is/are disposed) about each of those orthogonal axes. For example, if a magnetometer has 3 orthogonal sense axes (x, y, and z), the aforementioned method can be used with the magnetic field measurements about each of those axes to calculate the rates of rotation about each of those orthogonal axes. Such a process comprises counting the number of peaks ($N_x$, $N_y$, $N_z$) in the magnetometer data for each individual orthogonal magnetometer sense axis x, y, and z respectively, in a given measurement duration of time T. The measurement duration or the magnetometer output sampling time (time T) can also be different for each of the magnetometer's orthogonal sense axes ($T_x$, $T_y$, $T_z$). The angular rates of rotation about the orthogonal x, y, and z axis are then given by $\Omega_x$, $\Omega_y$, $\Omega_z$, where $\Omega_x=(360*N_x)/T_x$, $\Omega_y=(360*N_y)/T_y$, and $\Omega_z=(360*N_z)/T_z$, respectively, where in an exemplary embodiment $T_x=T_y=T_z=T$. A composite rate of rotation, $\vec{\Omega}$, during the measurement or sample period of duration T is then given in vector form by $\vec{\Omega}=\Omega_x\hat{x}+\Omega_y\hat{y}+\Omega_z\hat{z}$, where $\hat{x}$, $\hat{y}$, and $\hat{z}$, represent unit vectors along each of the three orthogonal sense axes. The magnitude of the composite rate of angular displacement, $|\hat{\Omega}|$, during the measurement duration T can then be calculated as $|\hat{\Omega}|=\sqrt{\Omega_x^2+\Omega_y^2+\Omega_z^2}$. The magnitude of the composite rate of angular displacement $|\hat{\Omega}|$ can also be simply represented as $|\Omega|$ or just $\Omega$. This magnitude of the composite rate of angular displacement of the magnetometer is the same as that of the object upon or within which the magnetometer is disposed.

In at least an embodiment of this method, steps for peak-detection/frequency detection are disclosed.

Any number of existing implementations (hardware, software, or both) can be utilized together with aforementioned magnetic field sensing method to count or deduce the number of peaks N or ($N_x$, $N_y$, $N_z$) present in the magnetometer measurement, and thereby calculate the rate of angular displacement of the magnetometer or the object on/in which the magnetometer is disposed.

In at least an embodiment, measurement of peak(s) can be analog or digital and that a measurement can also just be a list of numbers or values. A "peak" or a "valley" or a "trough" or an "inflection" can represent a local or a global maximum (maxima) or minimum (minima) in the set of values or numbers that comprise an analog or digital measurement sample. Essentially, a peak is a point or a data point or a set of data points or a set of values that are essentially (more or less) constant or uniform or unchanging with respect to its/their neighboring (in time) data points/set of values, which is mathematically defined as a region of zero slope or zero gradient with respect to another variable (such as time in this case).

In at least an embodiment, frequency-to-voltage converters are used in accordance with the system and method of this invention.

A frequency-to-voltage converter integrated circuit (IC) or application specific integrated circuit (ASIC) can be used to return an analog or a digital value proportional to the frequency or the number of peaks in the magnetometer measurement or measurement segment/s or measurement sample/s. The magnetometer/s (digital and/or analog) output/s are the input/s to one or more of such frequency-to-voltage converter ICs (single or multiple input channels per IC). The output of the frequency-to-voltage ICs (single or multiple output channels per IC) is an analog or digital voltage value that is proportional to the number of peaks in the magnetometer output during the sample period of duration T. Similarly, the output of the frequency-to-voltage converter ICs could depend on the frequency of occurrence of peaks in the magnetometer output signal during the sample period of duration T.

In yet another instance, the output of the frequency-to-voltage converter ICs could depend inversely on the time between consecutive peaks in the magnetometer output signal during the sample period of duration T. It is to be noted that the magnetometer output signal can consist of one or more sample periods, each of equal duration T or of unequal durations.

In an alternative embodiment, a voltage-to-frequency converter IC can be used in Frequency-to-Voltage mode to measure the frequency of peak occurrence in the magnetometer/s output/s.

In at least an alternative embodiment, peak-counter-to-voltage circuits are used in accordance with the system and method of this invention.

In this alternative embodiment, each of the outputs (with each output corresponding to each sense axis of the magnetometer) of each of the one or more magnetometers could be further processed by a peak counting circuit 5, implemented in hardware using one or more of the following component ICs and/or circuit components: comparator 6, Schmitt trigger, one-shot (monostable multivibrator), low-pass filter, integrating capacitor and resistor, DC-blocking capacitor, high-pass filter. In an embodiment, the output of the magnetometer could be optionally input through a DC-blocking capacitor or a high-pass filter. This filtered signal (or the unfiltered signal directly from the magnetometer output) is then fed as an input to the comparator 6 which converts the analog magnetometer waveform into square pulses with "HIGH" or "ON" durations (in time) corresponding to or proportional to the duration of the pulses in the magnetometer waveform. The comparator 6 could also, optionally, be designed with hysteresis such that that rising and falling edges of the square pulses are triggered (or generated) at an adjustable value that is closer to or further away from the magnetometer output pulse peak value or to introduce noise-immunity (also known as a Schmitt trigger). The output of the comparator (or the Schmitt trigger) 6 is then fed as input to the one-shot (monostable multivibrator). The one-shot triggers square pulses corresponding to the rising (or falling) edges of the square waves output by the preceding comparator (or Schmitt trigger) 6. The output of the one-shot is then input to a low-pass filter (or an integrator) that outputs an analog voltage proportional to the frequency of pulses present in the magnetometer output/s. The low-pass filter output can be further processed or digitized for additional calculations/processing. The low-pass filter output is proportional to the angular displacement (rotation) rate of the magnetometer or the object on/in which it is disposed. This angular displacement (rotation) rate can then be determined from the low-pass filter output via additional processing or calculations, for example, by dividing it by the proportionality constant determined via a calibration routine (see "Calibration" section below).

In at least another alternative embodiment, peak counter/frequency counters are used in accordance with the system and method of this invention.

In this another alternative embodiment, the output/s of the magnetometer/s is fed as an input to a peak counter or a frequency counter (or a cymometer). The output of the frequency counter is the number of peaks N present in a measurement sample of duration T. This output can be in the form of an analog voltage or a digital value that can then be transmitted wirelessly and/or stored in one or more on-board memory units/chips/ICs. There are several implementations for a peak-counter circuit. An exemplary peak counting circuit utilizes a comparator which takes the magnetometer sense output/data as inputs and generates square pulses (or digital pulses) whenever the magnetometer data amplitude exceeds a user-defined threshold value (defined via external hysteresis added to the comparator (also known as a Schmitt trigger)). The output of the comparator (or Schmitt trigger) is then fed as an input to a microcontroller (or a similar computation unit/IC) that counts the number of peaks N present in its input signal during an arbitrary measurement duration T. A measurement of duration T can also be decomposed into several smaller measurements, each of the same or different duration/s.

In yet another embodiment, the output of the comparator (or the Schmitt trigger) is fed into a digital gate, which lets the (square or digitized) pulses through to a counter IC, for a user-defined duration G. The output of the counter can optionally be latched to hold the value of the measurement for a given duration. The output of the counter can be stored in a memory unit (or IC) and/or displayed and/or wirelessly transmitted. The duration G can be set or controlled using a time-base or a clock such as the internal clock of a microcontroller or a crystal oscillator fed through a decade-divider circuit and flip-flop. Alternatively, the microcontroller IC could be used to generate the gating pulse of duration G, that could optionally be adjusted in real-time via a decision-based program (or sub-routine) stored and executed in the microcontroller or on an external computation device and transmitted to the microcontroller control program. The counter IC can be a single K-bit counter (where $2^K-1$ is the highest number of peaks that the counter can count to), or be a combination of multiple counter ICs in a ripple counter configuration where a K-bit counter is implemented using multiple counters of smaller counting range.

In yet another embodiment, the output of the comparator (or the Schmitt trigger) is fed directly into the counter IC, and the output of the counter IC is then used/processed further, as detailed in the earlier embodiment.

In at least an alternative embodiment, digital/software processing of magnetometer outputs are used in accordance with the system and method of this invention.

In yet another exemplary embodiment, the analog output/s of the one or more magnetometers could be digitized (or the magnetometer IC could directly output digitized values) and then stored on an on-board memory system and/or transmitted (in real-time or after some lag) to one or more peripheral processing device/s such as a computer, calculator, smartphone, a smart wearable device such as a smart watch, a smart headset, a smart headphone/earphone, a virtual reality/augmented reality headset/peripheral, a hearable, a heads-up display, etc. The digitized magnetometer output/s can then be further processed to extract the rotation rate, for example, by counting, in software via an algorithm, the number of peaks, N, present in the magnetometer output in a sample period or a measurement period of duration T. The rotation rate/s can then be deduced using the methods discussed above. Alternative processing includes calculating the frequency of peak occurrence in a time segment of the magnetometer output/s via a Fourier transform and then correlating the output of the Fourier transform (the dominant non-zero, non-artifact frequency) to a rotation rate. Several methods/algorithms exist for computing the Fourier transform of signals (such as Fast Fourier Transform algorithms including the several variants of the Cooley-Tukey FFT algorithm). Note that digital/software processing of the magnetometer/s outputs could be used as a stand-alone measurement system, or simultaneously with, or in addition to, the hardware methods for measuring frequency or rotation rate detailed above, thereby adding redundancy to the overall measurement system, or improving/affirming the accuracy of the measurements.

In at least an embodiment of this method, steps for calibration are disclosed.

Additionally, the output of the various frequency-to-voltage conversion methods detailed above may be calibrated such that the final output voltage is a known value at a particular known frequency or a particular known number of peaks or a particular known duration between consecutive peaks or a particular known rotation rate. Such calibration can occur just once, prior to any measurement. In an alternative scenario, such calibration can occur multiple times, either prior to a measurement, or after a certain number of measurements, or prior to the commencement of the next set of measurements, where a measurement is the act of deducing the number of peaks in the magnetometer signal or the frequency to thereby calculate the rate of rotation. One such calculation is discussed in the method steps disclosed, above, in this specification. Alternatively, the calibration routine can be used to determine and store (electronically in one or more memory units or ICs) a proportionality constant (with units of Volts/Hertz or its inverse, Volts/(degree/sec) or its inverse, or Volts/(radians/sec) or its inverse, or equivalent) that can then be used to calculate the frequency of magnetometer pulses or directly the rotation rate from the voltage output of the frequency-to-voltage converter/s or the low-pass filter output of the peak-counter-to-voltage circuit or the outputs of any of the schemes discussed above.

The aforementioned circuits, circuit blocks, ICs, ASICs, such as frequency-to-voltage converters, peak counters, and other ICs, or multiple ICs (to integrate redundancy into the system) can reside on a circuit board (or a printed circuit board or PCB) alongside the magnetometer or multiple magnetometers. The aforementioned ICs and associated circuit components and/or power supplies, batteries, wireless transmitters and receivers (of Wi-Fi, Bluetooth, other similar standards and protocols), transceivers, peripheral sensors, one or more single-axis magnetometers, or dual-axis magnetometers, or triple-axis magnetometers, inertial measurement units (IMUs) can be integrated onto a single die and/or across multiples dies with appropriate electrical connections between them (between their input and output connection pins), or on one or more substrates with electrical connections between the various components such as circuits, ICs, power source/s. The aforementioned assembly of circuit components, including the various ICs, ASICs, sensors, magnetometers, IMUs, can then reside (with or without further packaging such as a protective housing) inside (or on the surface of) an object/body.

In at least an embodiment, the (angular displacement) rotation axis, of the object, can be decomposed, arbitrarily, into a set of orthogonal rotation axes that correspond to the orthogonal magnetometer sense axes and can, therefore, be regarded to correspond to each other and can, therefore, also, be regarded as being the same (for the purposes of computation, measuring, analysis, and the like).

It is to be understood that, counting peaks in the aforementioned method can also be replaced equivalently with measuring or calculating frequency of peak occurrence in the magnetometer measurements (or data) for each individual orthogonal sense axis in a given arbitrary duration of measurement.

It is to be understood that, the * symbol used in equations or formulas presented in this application represents a mathematical operation of multiplication. In the mathematical formulas or equations presented the/symbol represents division or ratio.

It is to be understood that, the magnetometer in the aforementioned method description can be a single device with three orthogonal sense axes. Alternatively, the multiple-axis magnetometer can be an assembly of multiple individual devices (or magnetometers) assembled upon or within an object/body such that the sense axes of each magnetometer device is orthogonal to that of the other magnetometer devices in the assembly. In yet another embodiment, the single or multiple-axes magnetometer can be integrated with other sensors and actuators such as MEMS inertial measurement units (IMU) comprising one or more of MEMS gyroscopes, accelerometers, magnetometers, pressure sensors, barometers, and temperature sensors, on a single die or on multiple dies integrated with ASICs in a single package and/or housing.

In at least another embodiment of this method, steps for measuring the rate of angular displacement, of a traveling object having a trajectory, using magnetic field sensing are disclosed. This method uses a system comprising a magnetic field sensor, in said travelling object, to sense magnetic field sensor signals in terms of measurement data along each orthogonal rotation axis, a transmitter to transmit said data to a receiver; a receiver to receive said transmitted data, said receiver being communicably coupled to at least one processor, and a non-transitory computer readable storage medium comprising instructions that, when executed by the at least one processor, causes the system to perform at least one of the steps from the following steps:
transferring received data to said processor for storage and computation;
computing a composite average rate of angular displacement by:
reducing noise from said data to achieve relatively higher fidelity data;
segmenting said trajectory from said relatively higher fidelity data;
counting number of peaks present (N) in a measurement of a time duration (time T) using a peak detection algorithm controlled by a threshold parameter ($\alpha$) which is optimized for corresponding segmented trajectories; and
computing orientation of said traveling object, by integrating the composite average rate of angular displacement, along each orthogonal rotation axis, to obtain orientation data.

In at least an embodiment, 'relatively higher fidelity data' contains values that are closer to the actual measurement due to the removal or attenuation of deleterious noise and/or specific bands of frequencies of noise because they do not contribute to the relevance of the measurement.

In at least an embodiment, 'relatively higher fidelity data' is data that is filtered through a set of filters or filter banks or signal processor/s, that can enhance or attenuate one or more sets of frequency ranges and/or bands of frequencies.

In at least an embodiment, the system comprises an inertial measurement unit (IMU) further comprising one or more of a single-axis accelerometer or a multi-axis accelerometer providing accelerometer data; and at least one processor which causes the system to compute position of said traveling object, by using said orientation data to compensate for gravity on accelerometer measurement and then by double integrating said accelerometer data.

In at least an embodiment, the system comprises an inertial measurement unit (IMU) further comprising one or more of a single-axis gyroscope or a multi-axis gyroscope providing gyroscope data; and at least one processor which causes the system to use said gyroscope data to verify the fidelity of computed orientation of said traveling object.

In at least an embodiment, the traveling object is one of a linear traveling object, an angularly displacing traveling object, or a linearly traveling angularly displacing object.

In at least an embodiment, the magnetic field sensor is embedded in said travelling object.

Figure 3:
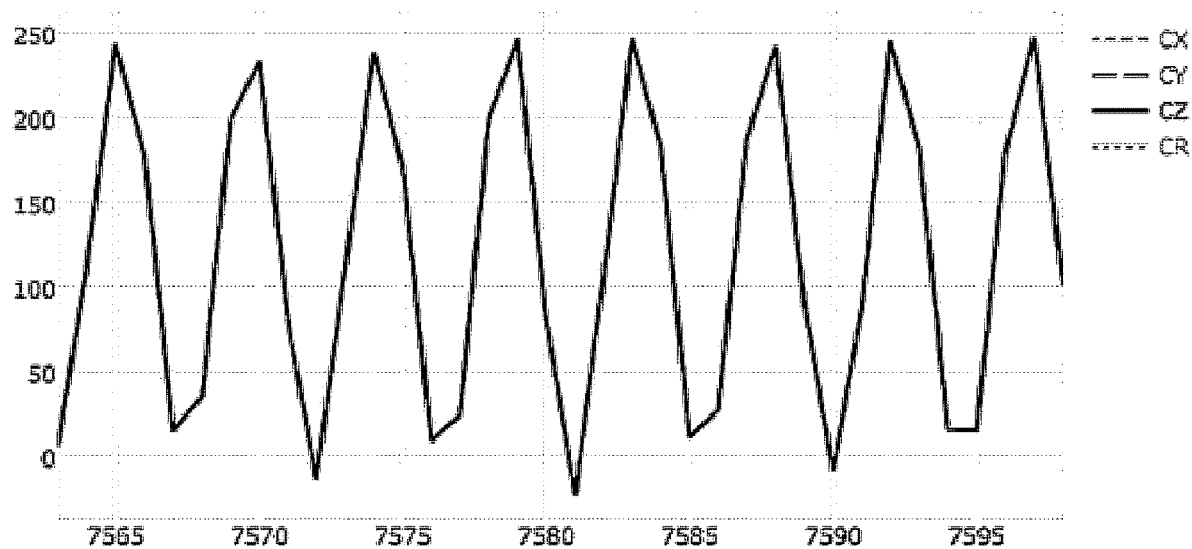
FIGS. 3 and 4 illustrate magnetic field intensity plotted over time for different trajectories.
Figure 4:
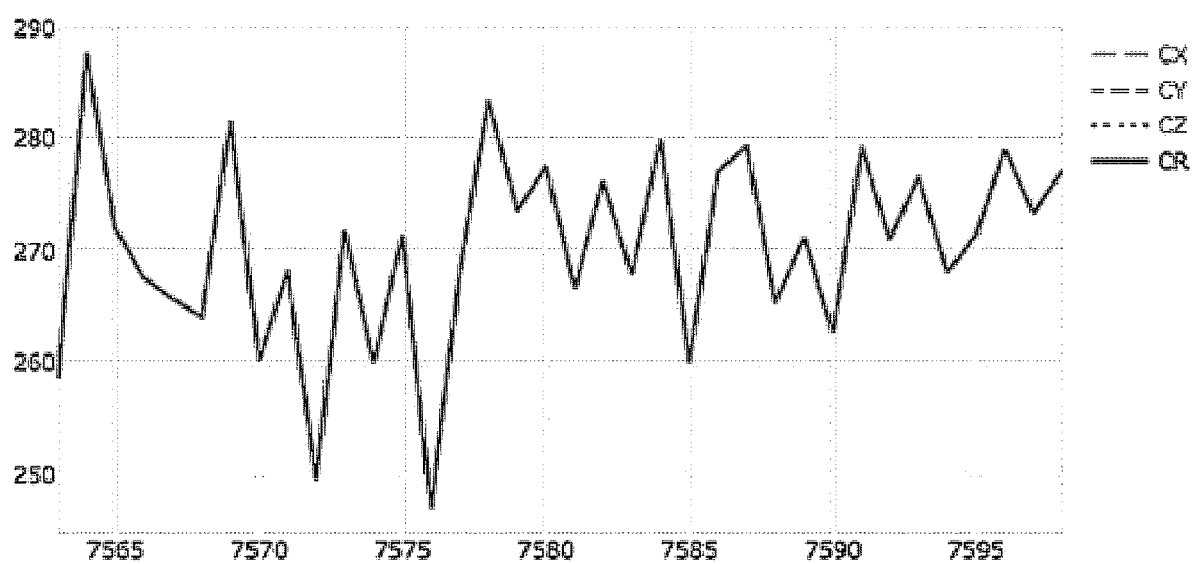

FIGS. 3 and 4 illustrate magnetic field intensity plotted over time for different trajectories. The Y-axis delineates various magnetic field intensity values, the X-axis delineates time-stamp values, time instances, or data point numbers, or data point indexing numbers.

The TECHNICAL ADVANCEMENT of this invention lies in providing a method for measuring the rate of angular displacement using magnetic field sensing, said method using a magnetometer's position which can be described and/or recorded as a composition of projections of the magnetic field onto the orthogonal sense axes of the magnetometer and using an effective calibration method to achieve results pertaining to angular displacement.

While this detailed description has disclosed certain specific embodiments for illustrative purposes, various modifications will be apparent to those skilled in the art which do not constitute departures from the spirit and scope of the invention as defined in the following claims, and it is to be distinctly understood that the foregoing descriptive matter is to be interpreted merely as illustrative of the invention and not as a limitation.

The invention claimed is:

1. A method for measuring the rate of angular displacement of a traveling object about one or more axes orthogonal to one another using magnetic field sensing, the method comprising: measuring magnetic field intensity and/or changes in the magnetic field intensity, projected onto a magnetic field sensor coupled to the traveling object, to generate scalar measurements over a time duration of the magnetic field intensity and/or changes in the magnetic field intensity, wherein each of the scalar measurements corresponds to one of the orthogonal axes; providing noise-immunity in the measurements with a comparator; determining, with a processor, a number of peaks in the measurements for the time duration, wherein the number of peaks is determined from determining regions where the measurements have a zero slope for the time duration; and computing the rate of angular displacement for the traveling object, as a function of the determined number of peaks and the time duration.

2. The method as claimed in claim 1, wherein the method further comprises:
determining a value proportional to a frequency of the determined number of peaks, detected by a peak counter, in the measurements.

3. The method as claimed in claim 1, wherein the computing further determines,
angular displacement of the traveling object for each of the orthogonal axes;
rate of angular displacement of the traveling object for each of the orthogonal axes; and/or
change in angle and/or orientation of the object.

4. The method as claimed in claim 1, wherein the magnetic field sensor is a single device with three orthogonal sense axes.

5. The method as claimed in claim 1, wherein the magnetic field sensor is a sensor selected from a group consisting of, a 1-axis magnetic field sensor, a 2-axis magnetic field sensor, and a 3-axis magnetic field sensor.

6. The method as claimed in claim 1, further comprising:
varying the number of measurements and/or varying the time duration based on a magnetic field across a trajectory of the object.

7. A system for measuring the rate of angular displacement of a traveling object about one or more axes orthogonal to one another using magnetic field sensing, the system comprising: a magnetic field sensor configured to measure magnetic field intensity and/or changes in the magnetic field intensity, projected onto the magnetic field sensor, to generate scalar measurements over a time duration of the magnetic field intensity and/or changes in the magnetic field intensity, wherein each of the scalar measurements corresponds to one of the orthogonal axes; a comparator configured to provide noise-immunity in the measurements; at least one processor coupled with a non-transitory computer readable storage medium storing instructions that, when executed by the processor, cause the processor to: determine a number of peaks in the measurements for the time duration, wherein the number of peaks is determined from determining regions where the measurements have a zero slope for the time duration and compute the rate of angular displacement for the traveling object, as a function of the determined number of peaks and the time duration.

8. The system as claimed in claim 7, wherein the processor, with instructions, is further configured to: determine changing magnetic field intensity of the magnetic field about each of the axes based on change in projection of the magnetic field on the orthogonal axes in the measurements that correlates to the object's angular displacement, and
determine the magnetic field sensor's angular displacement and/or position, in an existing magnetic field, as a composition of measured change in projections of the magnetic field onto the orthogonal axes of the magnetic field sensor, to measure a rate of angular displacement of the object for each of the orthogonal axes.

9. The system as claimed in claim 7 wherein, the processor, with instructions, is further configured to:
determine the number of peaks from the scalar measurements from all of the orthogonal axes, and
compute a composite rate of angular displacement of the traveling object as a function of square root of sum of squares of the rate of angular displacement about one or more of the orthogonal axes.

10. The system as claimed in claim 7 wherein, the processor, with instructions, is further configured to:
compute a square root of sum of squares of the scalar measurements from all of the orthogonal axes to obtain a computed value,
count the number of peaks in the computed value, and
compute a composite rate of angular displacement of the traveling object about one or more of the orthogonal axes using the computed value and the counted number of peaks.

11. The system as claimed in claim 7, further comprising:
a frequency-to-voltage converter communicably coupled to the processor, wherein the converter is configured to determine a value proportional to a frequency of the determined number of peaks, detected by the peak counter, in the measurements.

12. The system as claimed in claim 7, wherein, the processor, with instructions, is further configured to determine:
angular displacement of the traveling object for each of the orthogonal axes;
rate of angular displacement of the traveling object for each of the orthogonal axes; and/or
change in angle and/or orientation of the object.

13. The system as claimed in claim 7, wherein the system further comprises:
an inertial measurement unit including one or more of a single-axis accelerometer or a multi-axis accelerometer providing accelerometer data, wherein the processor, with instructions is further configured to,
compute a position of the traveling object by using orientation data to compensate for gravity on the accelerometer data and double integrating the accelerometer data.

14. The system as claimed in claim 7, wherein the magnetic field sensor is a single device with three orthogonal sense axes.

15. The system as claimed in claim 7, wherein the magnetic field sensor is a sensor selected from a group consisting of, a 1-axis magnetic field sensor, a 2-axis magnetic field sensor, and a 3-axis magnetic field sensor.

16. The system as claimed in claim 7, wherein,
the system is configured to vary the number of measurements and/or vary the time duration based on a magnetic field across a trajectory of the object.

17. A system for measuring the rate of angular displacement of an object traveling along a trajectory using magnetic field sensing, the system comprising: a magnetic field sensor in the travelling object, wherein the sensor is configured to output magnetic field sensor signals of magnetic field intensity and/or changes in the magnetic field intensity, projected onto the magnetic field sensor; a transmitter configured to transmit the signals; a receiver configured to receive the data transmitted from the transmitter; and a processor coupled with a non-transitory computer readable storage medium storing instructions that, when executed by the processor, causes the processor to: compute a composite average rate of angular displacement by, reducing noise from the data to achieve relatively higher fidelity data, segmenting the trajectory from the relatively higher fidelity data; counting a number of peaks in the relatively higher fidelity data for a time duration using a threshold parameter optimized for corresponding segmented trajectories, wherein the number of peaks is determined from determining regions where the relatively higher fidelity data have a zero slope; and compute an orientation of the traveling object by integrating the composite average rate of angular displacement.

18. A system as claimed in claim 17, further comprising:
one or more of a single-axis accelerometer or a multi-axis accelerometer providing accelerometer data, wherein the processor is further configured to compute a position of the traveling object by using orientation data to compensate for gravity on accelerometer measurement and double integrating the accelerometer data.

19. A system as claimed in claim 17 wherein, the system comprising:
one or more of a single-axis gyroscope or a multi-axis gyroscope providing gyroscope data, wherein the processor is further configured to use the gyroscope data to verify fidelity of the computed orientation of the traveling object.

20. A system as claimed in claim 17, wherein the traveling object is one of, a linearly traveling object, an angularly displacing traveling object, and a linearly traveling angularly displacing object.

21. A system as claimed in claim 17, wherein the magnetic field sensor is embedded in the travelling object.

* * * * *